(12) United States Patent
Uchida et al.

(10) Patent No.: US 9,257,400 B2
(45) Date of Patent: Feb. 9, 2016

(54) SEMICONDUCTOR DEVICE

(71) Applicant: Renesas Electronics Corporation, Kawasaki-shi, Kanagawa (JP)

(72) Inventors: Shinichi Uchida, Kanagawa (JP); Kenji Nishikawa, Kanagawa (JP); Masato Kanno, Kanagawa (JP); Mika Yonezawa, Kanagawa (JP); Shunichi Kaeriyama, Kanagawa (JP); Toshinori Kiyohara, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 14/487,762

(22) Filed: Sep. 16, 2014

(65) Prior Publication Data

US 2015/0084209 A1 Mar. 26, 2015

(30) Foreign Application Priority Data

Sep. 25, 2013 (JP) ................. 2013-198300

(51) Int. Cl.
| | |
|---|---|
| *H01L 23/48* | (2006.01) |
| *H01L 23/52* | (2006.01) |
| *H01L 29/40* | (2006.01) |
| *H01L 23/00* | (2006.01) |
| *H01L 23/495* | (2006.01) |
| *H01L 23/522* | (2006.01) |
| *H01L 29/06* | (2006.01) |
| *H01L 23/31* | (2006.01) |

(52) U.S. Cl.
CPC .......... *H01L 24/06* (2013.01); *H01L 23/49503* (2013.01); *H01L 23/49575* (2013.01); *H01L 23/5227* (2013.01); *H01L 23/3107* (2013.01); *H01L 23/49513* (2013.01); *H01L 23/49551* (2013.01); *H01L 29/0657* (2013.01); *H01L 2224/05554* (2013.01); *H01L 2224/06181* (2013.01); *H01L 2924/13091* (2013.01)

(58) Field of Classification Search
CPC ... H01L 21/60; H01L 23/495; H01L 31/4952; H01L 31/49575; H01L 23/48; H01L 23/52; H01L 29/40
USPC .......................................... 257/777, 618, 666
See application file for complete search history.

(56) References Cited

U.S. PATENT DOCUMENTS

| | | | | |
|---|---|---|---|---|
| 8,378,470 | B2 | 2/2013 | Nakashiba et al. | |
| 2004/0188854 | A1* | 9/2004 | Konishi et al. | 257/777 |
| 2005/0110127 | A1* | 5/2005 | Kanemoto et al. | 257/686 |
| 2009/0286354 | A1* | 11/2009 | Matsukawa et al. | 438/107 |
| 2011/0291244 | A1* | 12/2011 | Takeshima | 257/618 |
| 2013/0127033 | A1* | 5/2013 | Nakashiba et al. | 257/676 |
| 2014/0021608 | A1* | 1/2014 | Choi | 257/738 |

FOREIGN PATENT DOCUMENTS

JP 2011-054800 A 3/2011

* cited by examiner

*Primary Examiner* — Phuc Dang
(74) *Attorney, Agent, or Firm* — Sughrue Mion, PLLC

(57) ABSTRACT

A semiconductor device has a chip mounting part, a first semiconductor chip, and a second semiconductor chip. The first semiconductor chip is mounted over the chip mounting part in a direction in which its first principal plane faces the chip mounting part. A part of the second semiconductor chip is mounted over the chip mounting part in a direction in which its third principal plane faces the first semiconductor chip. The element mounting part has a notch part. A part of the second semiconductor chip overlaps the notch part. In a region of the third principal plane of the second semiconductor chip that overlaps the notch part, a second electrode pad is provided.

15 Claims, 17 Drawing Sheets

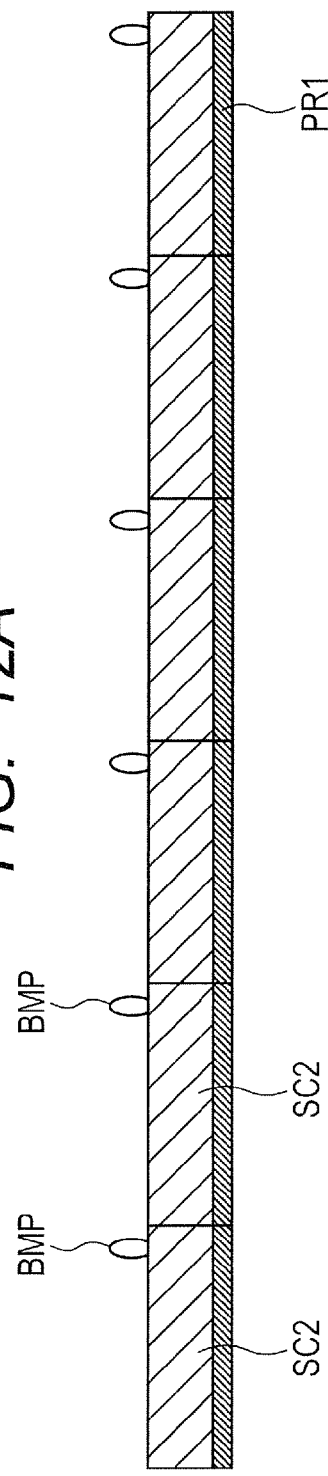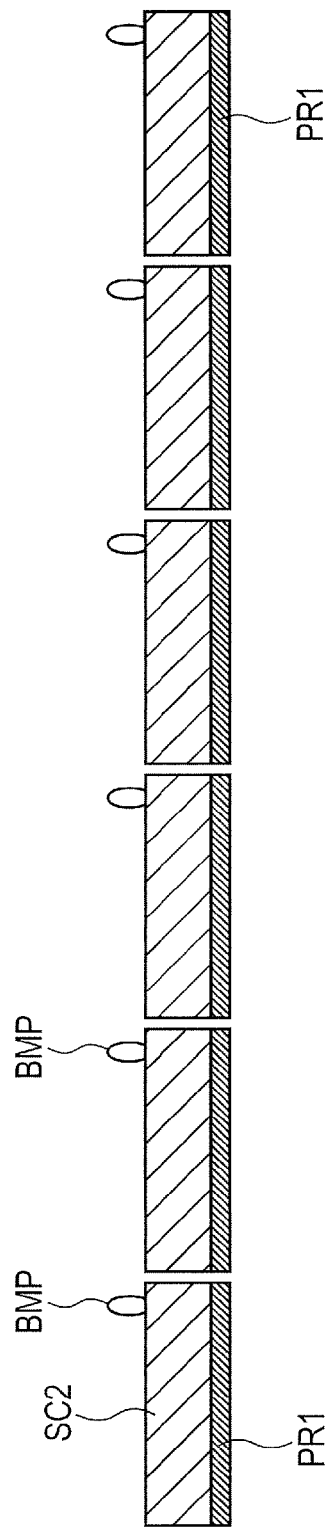

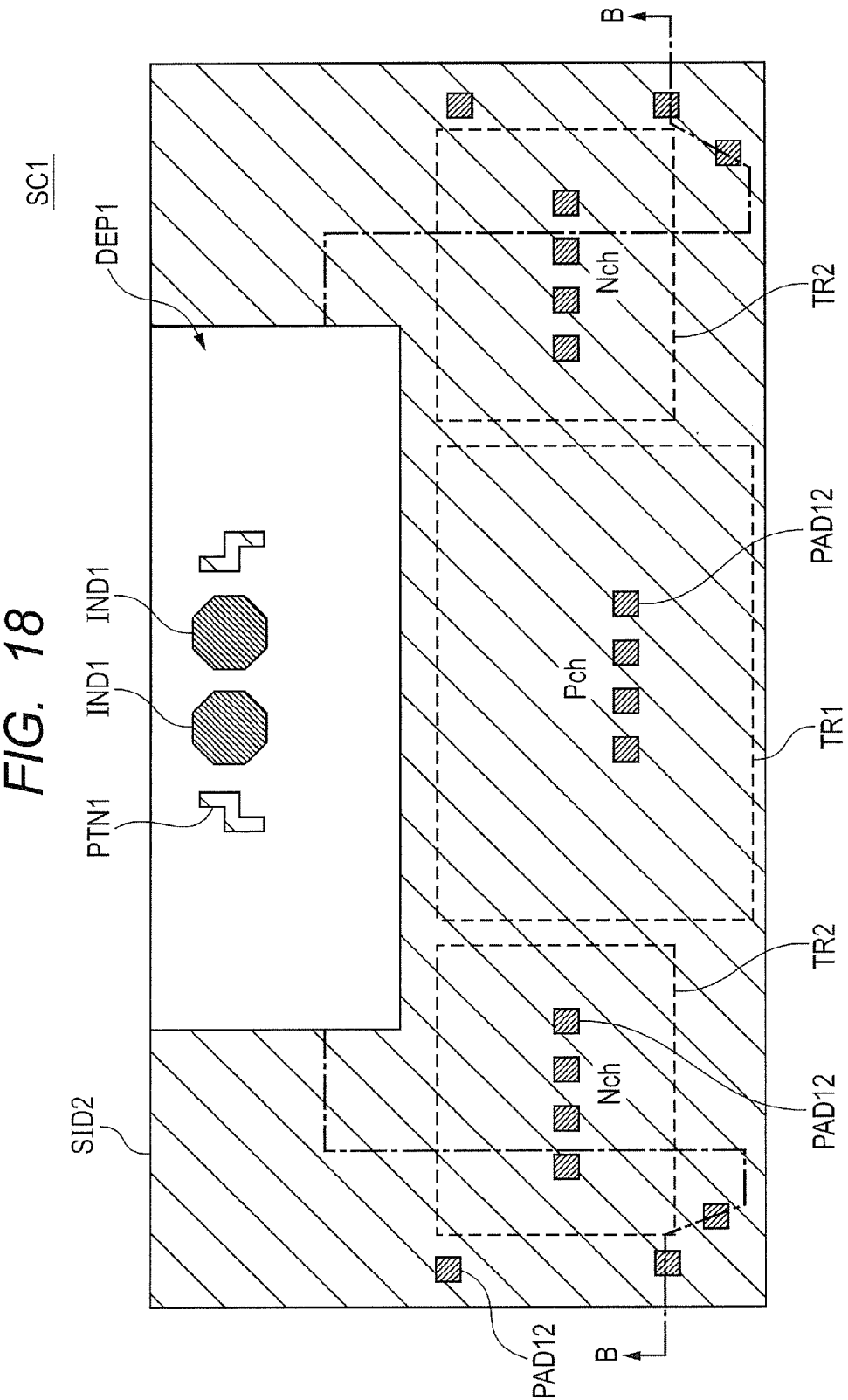

SEMICONDUCTOR DEVICE

CROSS-REFERENCE TO RELATED APPLICATIONS

The disclosure of Japanese Patent Application No. 2013-198300 filed on Sep. 25, 2013 including the specification, drawings and abstract is incorporated herein by reference in its entirety.

BACKGROUND

The present invention relates to a semiconductor device and is a technology applicable, for example, to a semiconductor device in which two semiconductor chips are layered.

Among the semiconductor devices, there is a device in which two semiconductor chips of a first semiconductor chip and a second semiconductor chip are layered with element formation planes thereof made to face mutually (for example, Japanese Unexamined Patent Application Publication No. 2011-54800). A technology described in Japanese Unexamined Patent Application Publication No. 2011-54800 is one that makes the first semiconductor chip and the second semiconductor chip transmit and receive a signal therebetween. Specifically, an inductor is formed in each of the first semiconductor chip and the second semiconductor chip, and these inductors are faced mutually. Then, transmission and reception of the signal is performed between the first semiconductor chip and the second semiconductor chip by transmitting and receiving the signal between these inductors.

Moreover, Japanese Unexamined Patent Application Publication No. 2011-54800 describes a semiconductor device in which the first semiconductor chip is mounted over an element mounting part of a lead frame, and further the second semiconductor chip is mounted over this first semiconductor chip. In this semiconductor device, a part of an element formation plane of the second semiconductor chip protrudes from the first semiconductor chip. Then, the second semiconductor chip and a lead terminal are coupled by using a bonding wire.

SUMMARY

The present inventors have examined a method whereby a first semiconductor chip is mounted over an element mounting part of a lead frame, a second semiconductor chip is mounted over this first semiconductor chip with its element formation plane faced to the first semiconductor chip, and further the second semiconductor chip and a lead terminal are coupled each other with a bonding wire. In this case, when the semiconductor device is miniaturized, as a result of the present inventors' examination, it has been considered that there comes out a possibility that a bonding head for coupling a bonding wire to the second semiconductor chip will interfere with the element mounting part. Other problems and new features will become clear from description and accompanying drawings of this specification.

According to one embodiment, the semiconductor device has a chip mounting part, a first semiconductor chip, and a second semiconductor chip. The first semiconductor chip is mounted over the chip mounting part in a direction in which its first principal plane faces the chip mounting part. A part of the second semiconductor chip is mounted over the first semiconductor chip in a direction in which its third principal plane faces the first semiconductor chip. The element mounting part has a notch part. A part of the second semiconductor chip overlaps the notch part. A second electrode pad is provided in a region of the third principal plane of the second semiconductor chip that overlaps the notch part. A first bonding wire couples to a first electrode pad of the first semiconductor chip, and a second bonding wire couples to the second electrode pad.

According to the one embodiment, it is possible to suppress a bonding head for coupling the bonding wire to the second semiconductor chip from interfering with the element mounting part.

BRIEF DESCRIPTION OF THE DRAWINGS

FIGS. 12A and 12B are sectional views for explaining a method for manufacturing a semiconductor device;
FIG. 18 is a plane view of a first semiconductor chip according to a modification.

DETAILED DESCRIPTION

Hereinafter, embodiments will be explained using drawings. Incidentally, in all the drawings, the same sign is given to the same component and its explanation is omitted suitably.

Embodiment

Figure 1:
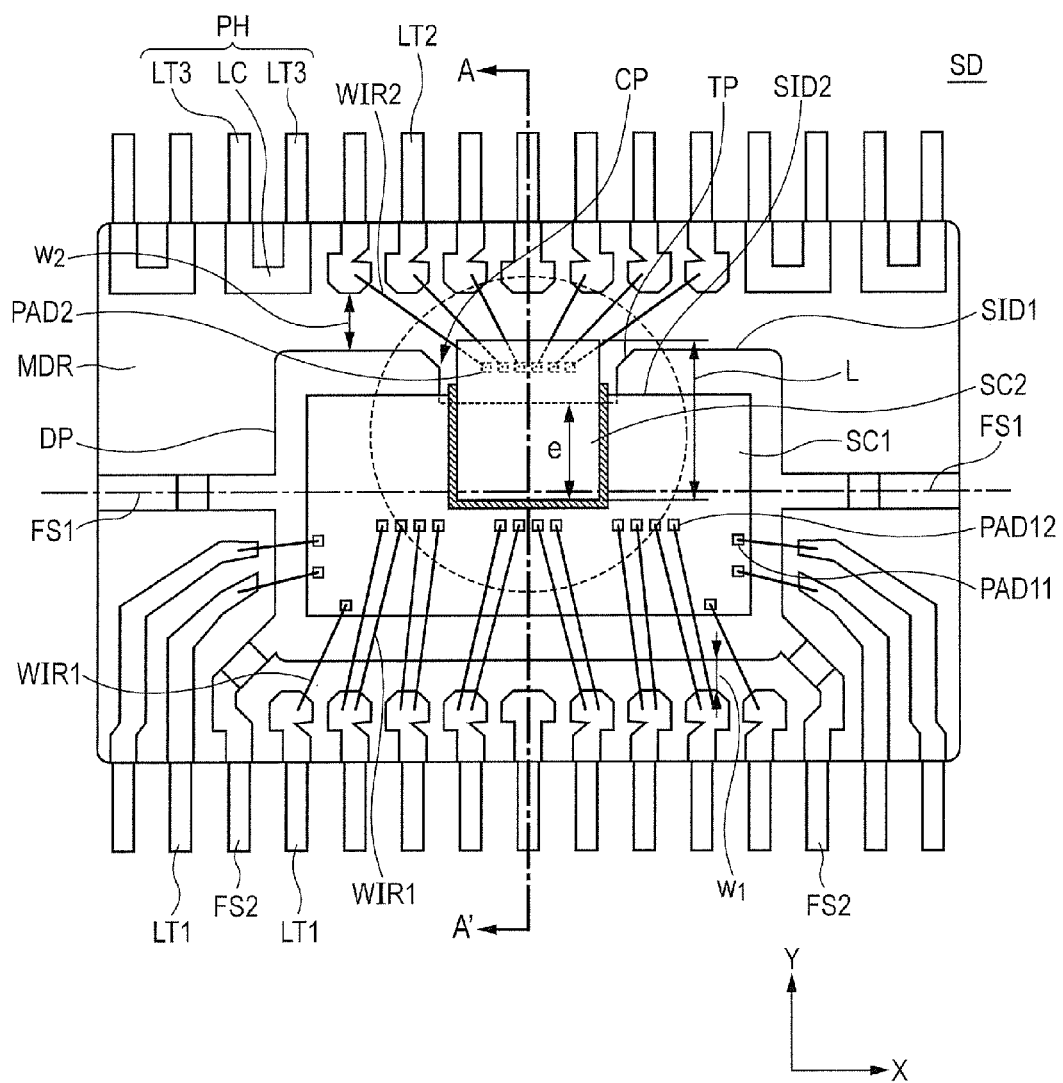
FIG. 1 is a plane view showing a configuration of a semiconductor device according to an embodiment.
Figure 2:
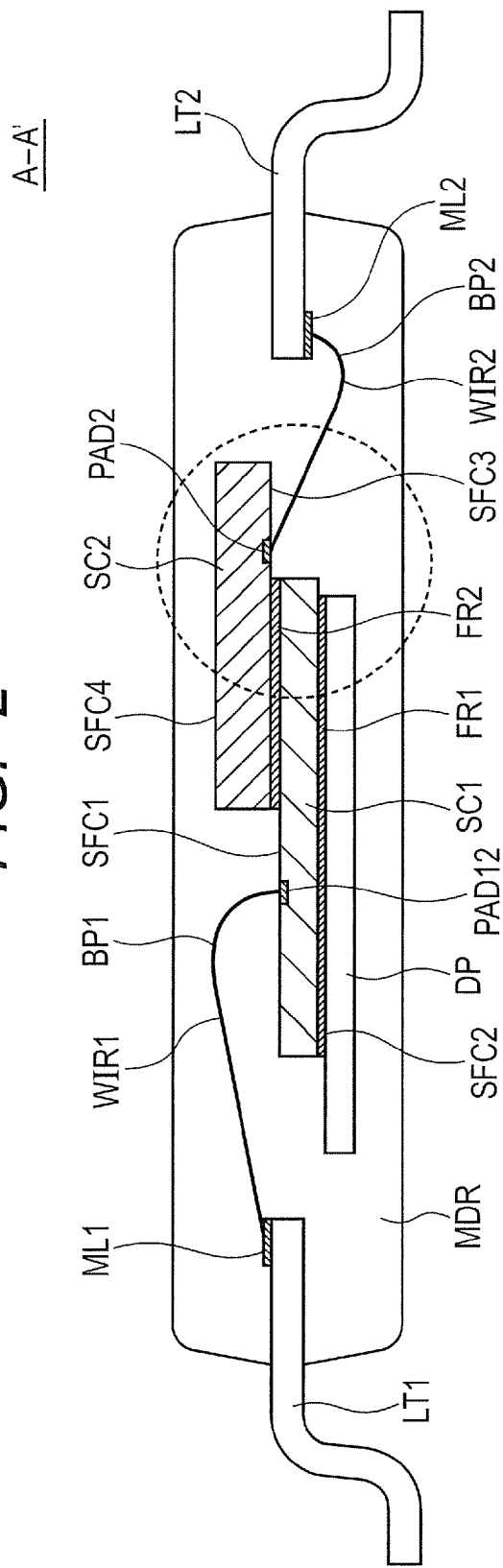
FIG. 2 is an A-A' sectional view of FIG. 1.
Figure 3:
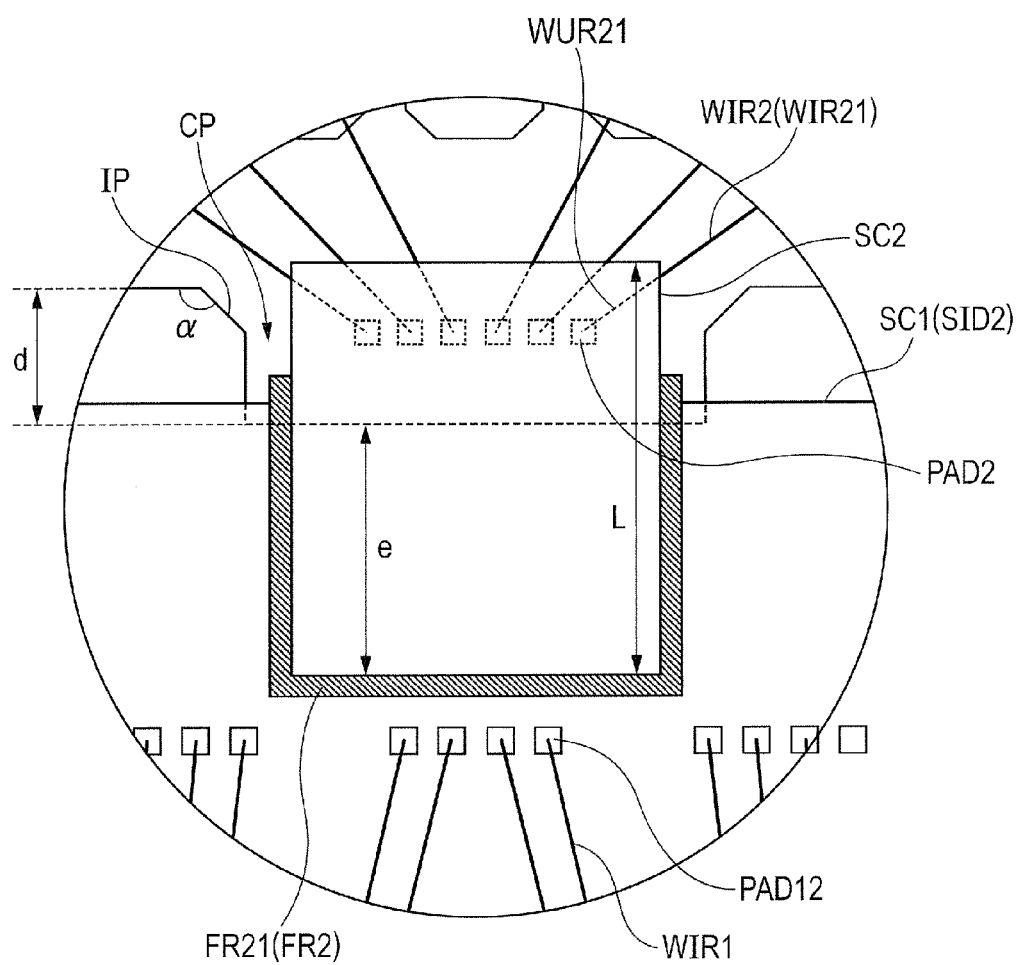
FIG. 3 is a diagram enlarging a region surrounded by a dotted line of FIG. 1.
Figure 4:
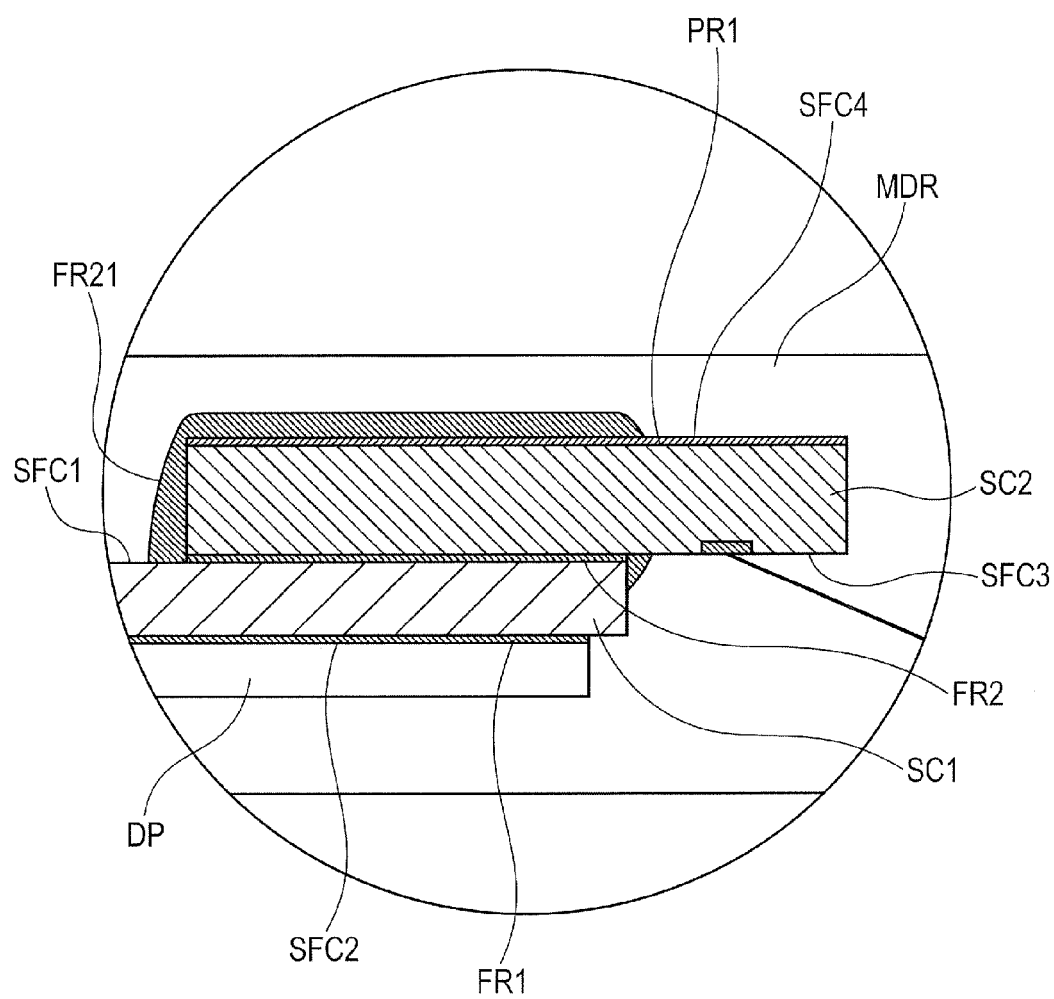
FIG. 4 is a diagram enlarging a region enclosed with a dotted line of FIG. 2.

FIG. 1 is a plane view showing a configuration of a semiconductor device SD according to an embodiment. FIG. 2 is an A-A' sectional view of FIG. 1. FIG. 3 is a diagram enlarging a region enclosed with a dotted line of FIG. 1. FIG. 4 is a diagram enlarging a region enclosed with a dotted line of FIG. 2. The semiconductor device SD according to the embodiment has a chip mounting part DP, a first semiconductor chip SC1, and a second semiconductor chip SC2. The first semiconductor chip SC1 is mounted over the chip mounting part DP; a part of the second semiconductor chip SC2 is mounted over the first semiconductor chip SC1.

In detail, as shown in FIG. 2, the first semiconductor chip SC1 has a first principal plane SFC1 and a second principal plane SFC2. The second principal plane SFC2 is a plane opposite to the first principal plane SFC1. The first semiconductor chip SC1 is mounted over the chip mounting part DP in a direction in which the second principal plane SFC2 faces the chip mounting part DP.

Moreover, as shown in FIG. 2, the second semiconductor chip SC2 has a third principal plane SFC3 and a fourth principal plane SFC4. The fourth principal plane SFC4 is a plane opposite to the third principal plane SFC3. Then, the part of the second semiconductor chip SC2 is mounted over the first semiconductor chip SC1 in a direction in which the third principal plane SFC3 faces the first principal plane SFC1.

As shown in FIG. 1 and FIG. 3, in plane view, the chip mounting part DP has a notch part CP. A part of the second semiconductor chip SC2 overlaps the notch part CP. Moreover, in a portion of the first principal plane SFC1 of the first semiconductor chip SC1 that does not overlap the second semiconductor chip SC2, first electrode pads PAD11, PAD12 are provided; in a region of the third principal plane SFC3 of the second semiconductor chip SC2 that does not overlap the notch part CP, a second electrode pad PAD2 is provided. In addition, the semiconductor device SD has a first bonding wire WIR1 and a second bonding wire WIR2. One end of the first bonding wire WIR1 is coupled to the first electrode pad PAD11 (or the first electrode pad PAD12); one end of the second bonding wire WIR2 is coupled to the second electrode pad PAD2. In the following, they will be explained in detail.

The first semiconductor chip SC1 is, for example, a semiconductor chip for power control and has a power transistor for power control and a control circuit for controlling this power transistor. Further, the first semiconductor chip SC1 may have a logic circuit. The second semiconductor chip SC2 is, for example, a microcomputer (a microcontroller (MCU: Micro Control Unit), a microprocessor (MPU: Micro-Processing Unit)), or the like. Then, the first semiconductor chip SC1 is larger in size than the second semiconductor chip SC2. In this case, as shown in this embodiment, a structure of the semiconductor device SD is stabilized by locating the first semiconductor chip SC1 under the second semiconductor chip SC2. However, the first semiconductor chip SC1 may have a size of the same order as that of the second semiconductor chip SC2.

Moreover, the second semiconductor chip SC2 is made thicker than the first semiconductor chip SC1. For example, the thickness of the first semiconductor chip SC1 is not less than 100 µm and not more than 300 µm; the thickness of the second semiconductor chip SC2 is not less than 300 µm and not more than 500 µm.

In an example shown in FIG. 1 and FIG. 2, the chip mounting part DP is a die pad of a lead frame, and is an approximately polygon, for example, a rectangle. Then, the notch part CP is provided on a side SID1 of the chip mounting part DP. Designating a length of the second semiconductor chip SC2 both in plane view and in a direction perpendicular to the side SID1 as L (refer to FIGS. 1 and 3), a distance e from an end of a portion of the second semiconductor chip SC2 that is located on the first semiconductor chip SC1 to the notch part CP is set to more than or equal to L/2 (refer to FIGS. 1 and 3). In the example shown in FIG. 1, the chip mounting part DP is an approximately rectangle and the side SID1 is a long side of the chip mounting part DP. Then, one end of a support part FS1 (for example, a suspension lead) couples to each of two sides that intersect the side SID1 among three remaining sides of the chip mounting part DP. In the example shown in FIG. 1, the support part FS1 is coupled to almost a center of a short side of the chip mounting part DP.

Moreover, a support part FS2 is also coupled to the chip mounting part DP. The support part FS2 is also the suspension lead, and is located between lead terminals of the lead frame. In other words, the support part FS2 is such that a terminal being coupled to neither the first semiconductor chip SC1 nor the second semiconductor chip SC2 among the lead terminals is made to be the suspension lead. For this reason, an end of the support part FS2 that is not coupled to the chip mounting part DP extends to the outside of a sealing resin MDR (to be described later). By the support part FS2 being provided, a position and a direction of the chip mounting part DP are stabilized. Moreover, since the lead terminal is diverted as the support part FS2, it is possible to suppress the lead frame from enlarging as compared with the case of adding newly the suspension lead.

In the example shown in FIG. 1, multiple second lead terminals LT2 are provided on a side of the chip mounting part DP that faces the side SID1. Then, in plane view, multiple first lead terminals LT1 are provided on the opposite side of the second lead terminals LT2 across the chip mounting part DP. The other end of the second bonding wire WIR2 couples to the second lead terminal LT2, and the other end of the first bonding wire WIR1 couples to the first lead terminal LT1. Then, the support part FS2 is provided among the multiple first lead terminals LT1. Specifically, two support parts FS2 are provided. The two support parts FS2 are coupled to two angles that are not linked to the side SID1 among four angles of the chip mounting part DP, respectively. Incidentally, ends of the first lead terminals LT1 that are coupled to the first bonding wires WIR1 face the short side of the chip mounting part DP.

Moreover, a plane of the first lead terminal LT1 to which the first bonding wire WIR1 is coupled (in an example shown in FIG. 2, a plane opposite to the first principal plane SFC1 of the first semiconductor chip SC1) and a plane of the second lead terminal LT1 to which the second bonding wire WIR2 is coupled (in the example shown in FIG. 2, a plane opposite to the third principal plane SFC3 of the second semiconductor chip SC2) are opposite mutually. Then, a metal layer ML1 is formed over a plane of a wire coupling side end of the first lead terminal LT1 to which the first bonding wire WIR1 is coupled; a metal layer ML2 is formed over a plane of a wire coupling side end of the second lead terminal LT2 to which the second bonding wire WIR2 is coupled. In other words, a plane of the second lead terminal LT2 over which the metal layer ML2 is formed is opposite to a plane of the first lead terminal LT1 over which the metal layer ML1 is formed. The metal layers ML1, ML2 are formed with a metal that easily join the bonding wire. In the case where the bonding wire is a gold wire, the metal layers ML1, ML2 are formed, for example, of tin silver plating or the like.

Incidentally, since the first semiconductor chip SC1 is mounted over the chip mounting part DP, it is desirable that a potential of the chip mounting part DP agrees with a substrate potential of the first semiconductor chip SC1. In the case where the first semiconductor chip SC1 is an element for power control, a large difference occurs between the substrate potential of the first semiconductor chip SC1 and a substrate potential of the second semiconductor chip SC2. For this reason, if the chip mounting part DP and the second lead terminals LT2 are brought close to each other, there arises a possibility that it will become impossible to secure insulation between them. In contrast to this, in the example shown in FIG. 1, a distance $w_2$ from the second lead terminal LT2 to the chip mounting part DP is larger than a distance $w_1$ from the first lead terminal LT1 to the chip mounting part DP in plane view. For this reason, it is possible to secure insulation between the chip mounting part DP and the second lead terminal LT2.

As shown in FIG. 2, each of the first bonding wire WIR1 and the second bonding wire WIR2 has an inflection point in a thickness direction of the semiconductor device SD.

In addition, in plane view, a distance from the first lead terminals LT1 to an inflection point $BP_1$ of the first bonding wire WIR1 is farther than a distance from the first electrode pad PAD11 (or the first electrode pad PAD12) of the first semiconductor chip SC1 to the inflection point $BP_1$. In addition, an angle of the other end of the first bonding wire WIR1 (the end coupled to the first lead terminal LT1) to the first lead terminal LT1 is smaller than an angle of the one end of the first bonding wire WIR1 (the end coupled to the first semiconductor chip SC1) to the first semiconductor chip SC1. This is because the one end of the first bonding wire WIR1 is coupled to the first electrode pad PAD11 (or the first electrode pad PAD12), and subsequently, the other end of the first bonding wire WIR1 is coupled to the second lead terminal LT2.

In contrast to this, in plane view, a distance from the second lead terminal LT2 to an inflection point $BP_2$ of the second bonding wire WIR2 is shorter than a distance from the second electrode pad PAD2 of the second semiconductor chip SC2 to the inflection point $BP_2$. In addition, an angle of the other end of the second bonding wire WIR2 (the end coupled to the second lead terminal LT2) to the second lead terminal LT2 is larger than an angle of the one end of the second bonding wire WIR2 (the end coupled to the second semiconductor chip SC2) to the second semiconductor chip SC2. This is because the one end of the second bonding wire WIR2 is coupled to the second electrode pad PAD2 after the other end of the second bonding wire WIR2 was coupled to the second lead terminal LT2.

Moreover, the semiconductor device SD has a resin holding part PH. The resin holding part PH is comprised of two adjacent third lead terminals LT3 and one terminal coupling part LC. The terminal coupling part LC mutually couples ends of the third lead terminal LT3 that are located inside the sealing resin MDR. The terminal coupling part LC is formed integrally with the third lead terminal LT3. In the example shown in FIG. 1, although the third lead terminals LT3 are arranged side by side with the second lead terminals LT2, they are not coupled to the bonding wire. Moreover, the bonding wire is also not coupled to the terminal coupling part LC. Then, the resin holding parts PH are provided on both sides of the multiple second lead terminals LT2, respectively, in a direction in which the side SID1 extends (an X-direction in FIG. 1). In other words, the multiple second lead terminals LT2 are provided between the first resin holding part PH and the second resin holding part PH. The resin holding part PH is provided in order to suppress the terminal coupling part LC from coming off from the sealing resin MDR.

Incidentally, in the example shown in FIG. 1, the number of the second lead terminals LT2 is fewer than the number of the first lead terminals LT1. For this reason, the resin holding part PH is arranged side by side with the second lead terminals LT2. However, in the case where the number of the first lead terminals LT1 is fewer than the number of the second lead terminals LT2, the resin holding part PH may be arranged side by side with the first lead terminals LT1.

The first semiconductor chip SC1 is arranged so as to overlap a center of the chip mounting part DP. In contrast to this, the second semiconductor chip SC2 is smaller than the first semiconductor chip SC1, and for this reason, it is placed approaching toward the side SID1 of the chip mounting part DP. In addition, the part of the second semiconductor chip SC2 protrudes from the first semiconductor chip SC1 in plane view, and this protruded portion overlaps the notch part CP provided in the chip mounting part DP.

In the example shown in FIG. 1, a width of the notch part CP is made larger than a width of the second semiconductor chip SC2 in a direction in which the side SID1 extends (the X-direction in FIG. 1). For this reason, in the X-direction of FIG. 1, the whole of the second semiconductor chip SC2 is located inside the notch part CP. However, in the X-direction of FIG. 1, an end of the second semiconductor chip SC2 may overlap the chip mounting part DP.

Moreover, in plane view, a taper is formed in an end TP on the opening side of the notch part CP. This taper faces a direction in which the notch part CP is increased in width as the position goes outward. Although an angle α of the end TP to the side SID1 (refer to FIG. 3) is, for example, not less than 135° and not more than 180°, it is not limited to this range.

A width of a side SID2 that faces the notch part CP of the first semiconductor chip SC1 is wider than the width of the notch part CP. For this reason, in the direction in which the side SID2 extends, both ends of portions of the first semiconductor chip SC1 that are located near the side SID2 are supported by the chip mounting part DP. Therefore, stability of the first semiconductor chip SC1 improves as compared with the case where a width of the chip mounting part DP in a direction perpendicular to the side SID2 is made small. Incidentally, in plane view, a part of the side SID2 overlaps the notch part CP.

The first semiconductor chip SC1 has a semiconductor element and a first multilayer wiring layer MINC1 (to be described layer) over the first principal plane SFC1. The first electrode pad PAD11 and the first electrode pad PAD12 are formed over the first multilayer wiring layer MINC1. In the example shown in FIG. 1, the first electrode pads PAD11 are arranged along a fringe of the first semiconductor chip SC1, and the first electrode pads PAD12 are arranged more inside of the first semiconductor chip SC1 than the first electrode pads PAD11 are. For this reason, a distance from the first electrode pad PAD12 to the second semiconductor chip SC2 is shorter than a distance from the first electrode pad PAD11 to the second semiconductor chip SC2. The first electrode pad PAD12 is coupled to a power transistor that the first semiconductor chip SC1 has; the first electrode pad PAD11 is coupled to either one of a control circuit or a logic circuit of this power transistor.

The second semiconductor chip SC2 has a semiconductor element and a second multilayer wiring layer MINC2 (to be described later) over the third principal plane SFC3. The second electrode pad PAD2 is formed over the second multilayer wiring layer MINC2.

Then, as details are shown in FIG. 4, the first semiconductor chip SC1 is fixed to the chip mounting part DP with the use of a fixed layer FR1. The chip mounting part DP is a conductive paste material, for example, silver paste, for example.

Moreover, as details are shown in FIG. 1 and FIG. 4, the second semiconductor chip SC2 is fixed over the first semiconductor chip SC1 with the use of a fixed layer FR2 in a direction in which the second multilayer wiring layer MINC2 faces the first multilayer wiring layer MINC1 of the first semiconductor chip SC1. The fixed layer FR2 is formed, for example, with the use of a non conductive film (NCF). Then, as shown in FIG. 3 and FIG. 4, a part of the fixed layer FR2 creeps up a portion of the side face of the second semiconductor chip SC2 that is located over the first semiconductor chip SC1 to form a fillet FR21.

Incidentally, the fourth principal plane SFC4 of the second semiconductor chip SC2 is covered with a protective layer PR1. In the example shown in FIG. 4, the protective layer PR1 covers a whole surface of the fourth principal plane SFC4. The protective layer PR1 is, for example, a die attachment film (DAF), and is provided in order to protect the second semiconductor chip SC2 when the second semiconductor chip SC2 is mounted over the first semiconductor chip SC1. Incidentally, the protective layer PR1 may not be provided.

Moreover, a first inductor IND1 (to be described later) is formed over the first multilayer wiring layer MINC1 of the first semiconductor chip SC1; the second inductor IND2 is formed over the second multilayer wiring layer MINC2 of the second semiconductor chip SC2. In plane view, the first inductor IND1 and the second inductor IND2 overlap each other, and they are electrically combined mutually (for example, inductive coupling). Then, a signal for power transistor control that the second semiconductor chip SC2 generated is inputted into a circuit for power transistor control of the first semiconductor chip SC1 through the second inductor IND2 and the first inductor IND1.

Furthermore, as shown in FIG. 1 and FIG. 2, the semiconductor device SD has the sealing resin MDR. The sealing resin MDR seals the followings: the chip mounting part DP; the first semiconductor chip SC1; the second semiconductor chip SC2; the first bonding wire WIR1; the second bonding wire WIR2; a coupling part of the first lead terminal LT1 with the first bonding wire WIR1; a coupling part of the second lead terminal LT2 with the second bonding wire WIR2; the terminal coupling part LC; a coupling part of the third lead terminal LT3 with the terminal coupling part LC; and a part of the support part FS2. In the example shown in FIG. 2, the back of the chip mounting part DP is located inside the sealing resin MDR. Incidentally, since FIG. 1 and FIG. 2 show one example of the sealing structure of the semiconductor device SD, the sealing structure of the semiconductor device SD is not limited to the example shown in FIG. 1 and FIG. 2.

Figure 5:
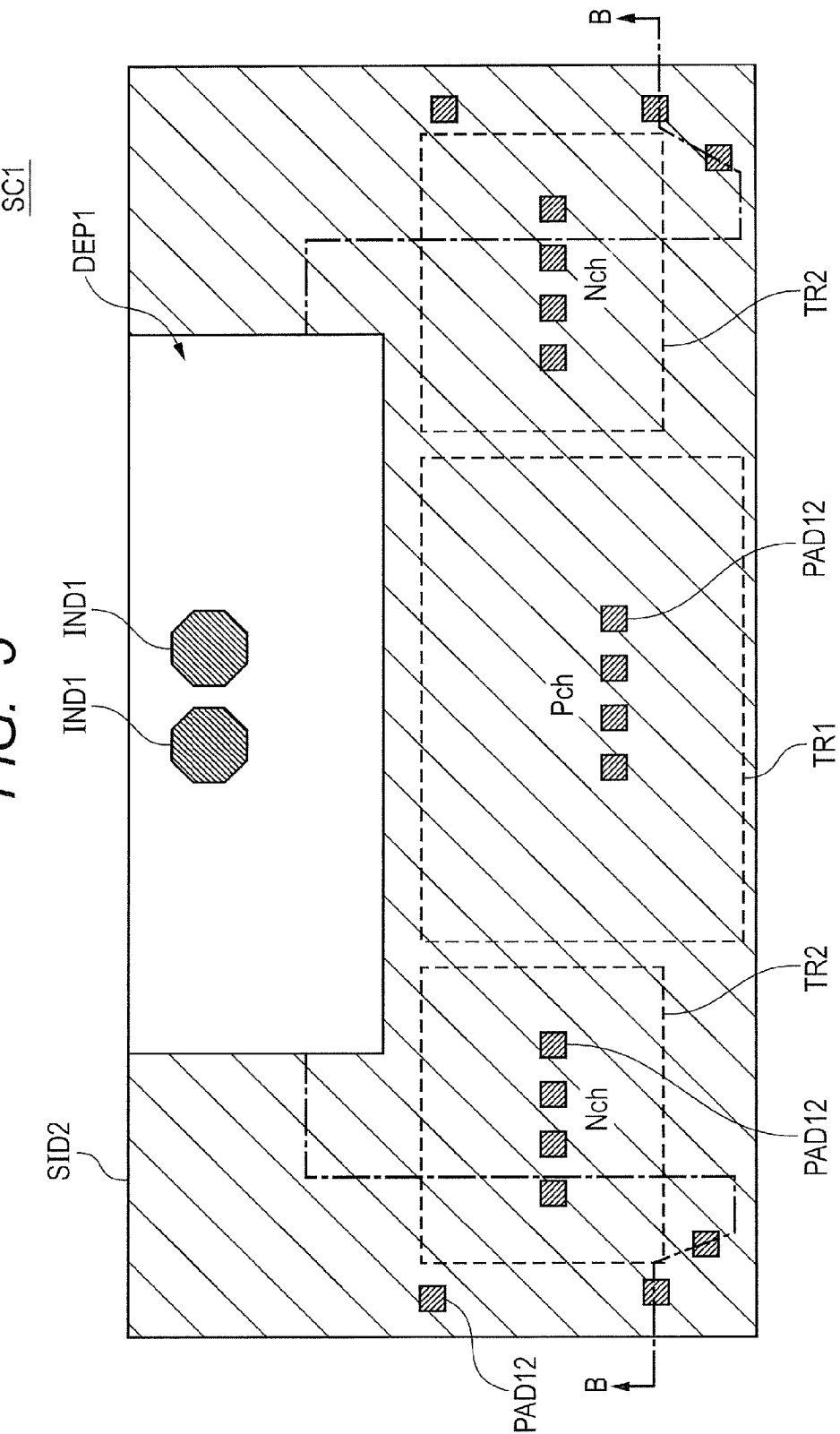
FIG. 5 is a plane view showing one example of a structure of a first semiconductor chip.
Figure 6:
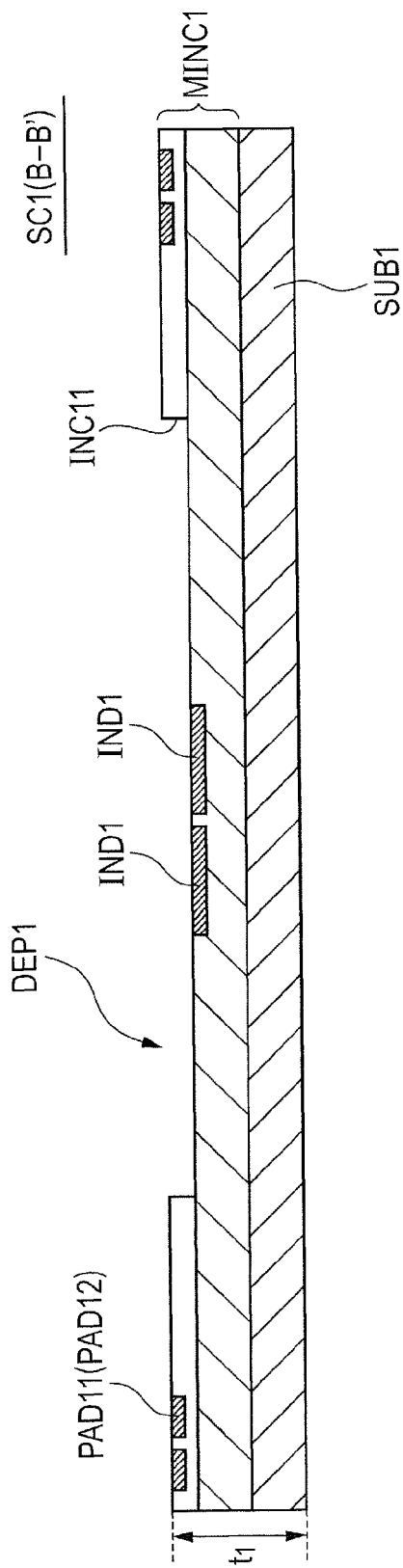
FIG. 6 is a B-B' sectional view of FIG. 5.

FIG. 5 is a plane view showing one example of a structure of the first semiconductor chip SC1. FIG. 6 is a B-B' sectional view of FIG. 5. As shown in FIG. 5, the first semiconductor chip SC1 has multiple transistors (in the example shown in this figure, a first transistor TR1 and two second transistors TR2) as elements for power control. The first transistor TR1 is a transistor of a first conductivity type (for example, a p-channel type), and the second transistors TR2 are transistors of a second conductivity type (for example, an n-channel type). The first transistor TR1 and the two second transistors TR2 are arranged along a side of the first semiconductor chip SC1 that is an opposite side of the side SID2. Then, the first transistor TR1 is located between the two second transistors TR2. Over the first transistor TR1 and the second transistors TR2, first electrode pads PAD12 that are coupled to the respective transistors are formed, respectively.

Moreover, the first semiconductor chip SC1 has at least one first inductor IND1 (in the example shown in this figure, two inductors). The first inductors IND1 are located in a region that overlaps the second semiconductor chip SC2 in plane view. As shown in FIG. 6, the first inductors IND1 are formed with the use of the first multilayer wiring layer MINC1. In other words, wiring (not illustrated) or via is formed in the same layer as the first inductor IND1. The first multilayer wiring layer MINC1 is formed over a first substrate SUB1. The first substrate SUB1 is a semiconductor substrate such as a silicon substrate, for example. Incidentally, the first transistor TR1 and the second transistors TR2 are formed over the first substrate SUB1. Moreover, a winding shaft of the first inductor IND1 faces in a direction that intersects the first substrate SUB1 (for example, a perpendicular direction).

Incidentally, as shown in FIG. 5 and FIG. 6, a first depression DEP1 is formed in a region of the first semiconductor chip SC1 that overlaps the second semiconductor chip SC2 in plane view. A width of the first depression DEP1 is larger than the width of the second semiconductor chip SC2. For this reason, when the first semiconductor chip SC1 and the second semiconductor chip SC2 are made to overlap each other, the second semiconductor chip SC2 fits into the first depression DEP1. Incidentally, since it is necessary for the part of the second semiconductor chip SC2 to protrude from the side SID2 to the outside of the first semiconductor chip SC1, the first depression DEP1 is continuous with the side SID2.

The first depression DEP1 is formed by not partially forming at least one layer of wiring layers (including a layer over which the first electrode pad PAD11 and the first electrode pad PAD12 are formed) that is located higher above the layer over which the first inductor IND1 is formed in the first multilayer wiring layer MINC1 that the first semiconductor chip SC1 has. This shortens a distance between the first inductor IND1 and a second inductor IND2 described later, and thereby precision of communication between them can be raised. Incidentally, the first semiconductor chip SC1 may not have the first depression DEP1.

Figure 7:
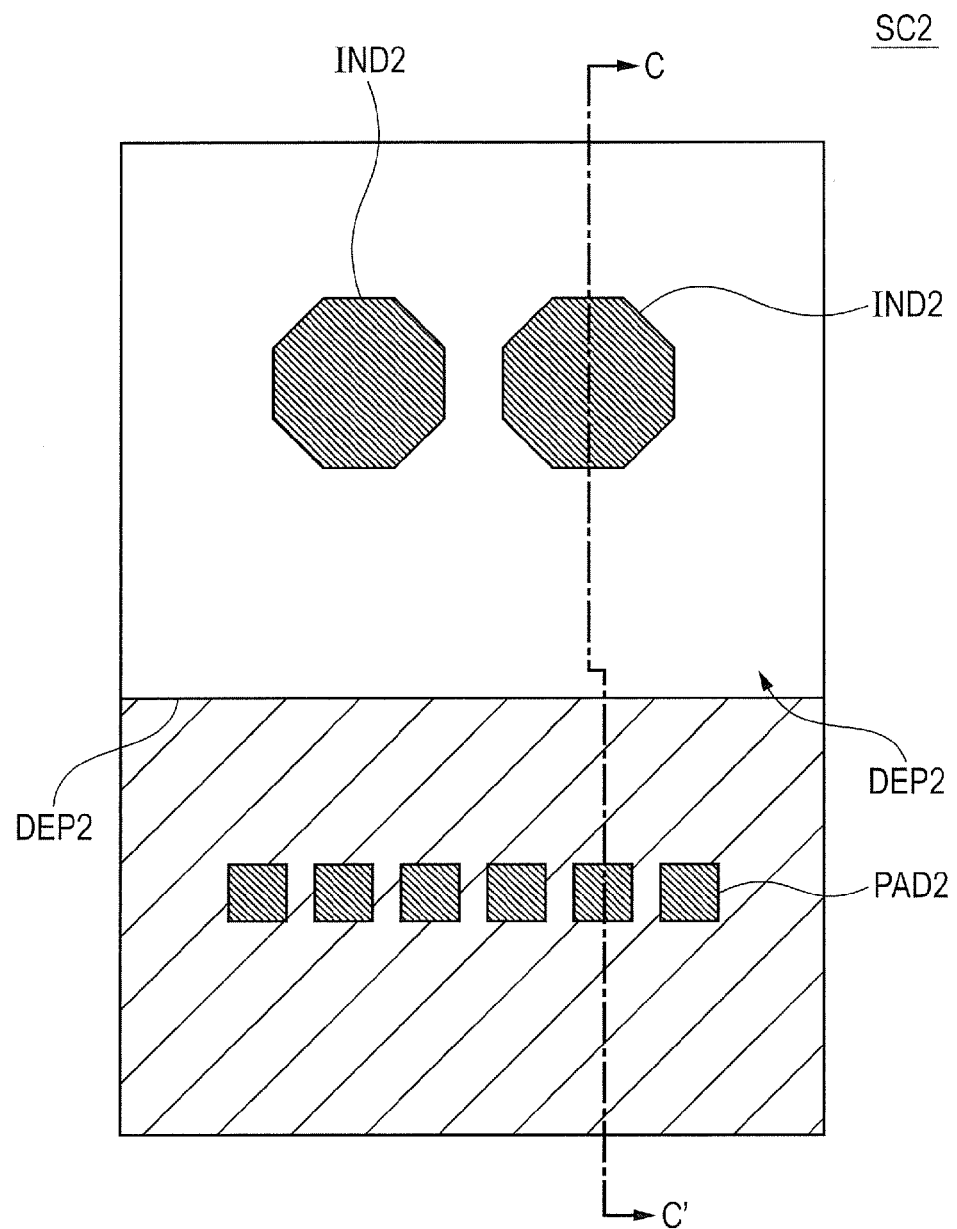
FIG. 7 is a plane view showing one example of a structure of a second semiconductor chip.
Figure 8:
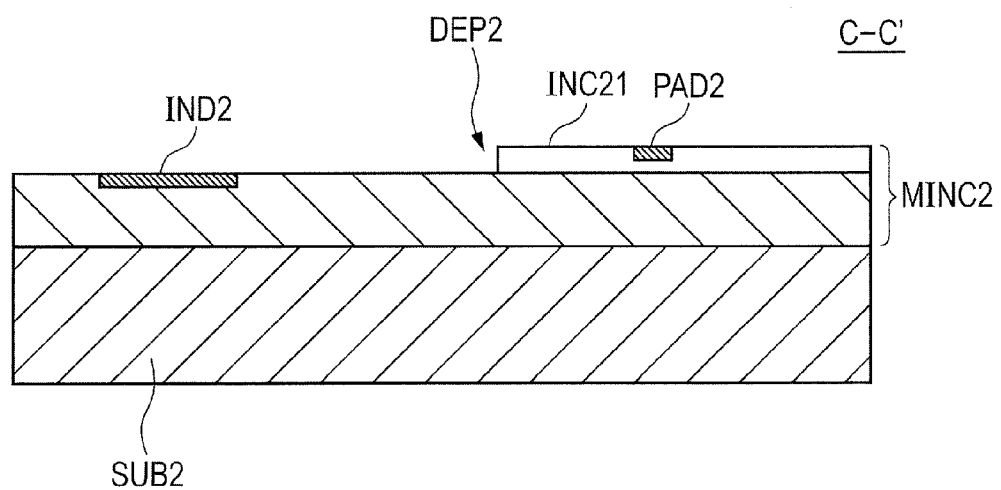
FIG. 8 is a C-C' sectional view of FIG. 7.

FIG. 7 is a plane view showing one example of a structure of the second semiconductor chip SC2. FIG. 8 is a C-C' sectional view of FIG. 7. The second semiconductor chip SC2 has at least one second inductor IND2 (in the example shown in this figure, two inductors). The number of the second inductors IND2 is the same as the number of the first inductors IND1. When the second semiconductor chip SC2 is arranged over the first semiconductor chip SC1, the second inductor IND2 is formed in a position where it overlaps the first inductor IND1. Thereby, the second semiconductor chip SC2 is enabled to communicate with the second semiconductor chip SC2 through the second inductor IND2 and the first inductor IND1 in a state where the second semiconductor chip SC2 is isolated from the first semiconductor chip SC1.

As shown in FIG. 8, the second inductor IND2 is formed with the use of the second multilayer wiring layer MINC2. The second multilayer wiring layer MINC2 is formed over a second substrate SUB2. The second substrate SUB2 is a semiconductor substrate such as a silicon substrate, for example. An element (for example, a MOS transistor) that forms a circuit is formed over the second substrate SUB2. Moreover, a center axis of the second inductor IND2 faces in a direction that intersects the second substrate SUB2 (for example, a perpendicular direction).

Incidentally, as shown in FIG. 7 and FIG. 8, a second depression DEP2 is formed in a region of the second semiconductor chip SC2 that overlaps the first semiconductor chip SC1 in plane view. The second depression DEP2 is continuous with three sides of the second semiconductor chip SC2.

The second depression DEP2 is formed by not partially forming at least one layer of wiring layers (including a layer over which the second electrode pad PAD2 is formed) that is located higher above the layer over which the second inductor IND2 is formed in the second multilayer wiring layer MINC2 that the second semiconductor chip SC2 has. This shortens a distance between the second inductor IND2 and the first inductor IND1, and thereby the precision of communication between them can be raised. Incidentally, the second semiconductor chip SC2 may not have the second depression DEP2.

Moreover, a thickness of the second substrate SUB2 is thicker than that of the first substrate SUB1. Thereby, the second semiconductor chip SC2 is made thicker than the first semiconductor chip SC1. The thickness of the second substrate SUB2 is, for example, not less than 300 μm and not more than 500 μm; a thickness of the first substrate SUB1 is, for example, not less than 100 μm and not more than 300 μm.

Figure 9:
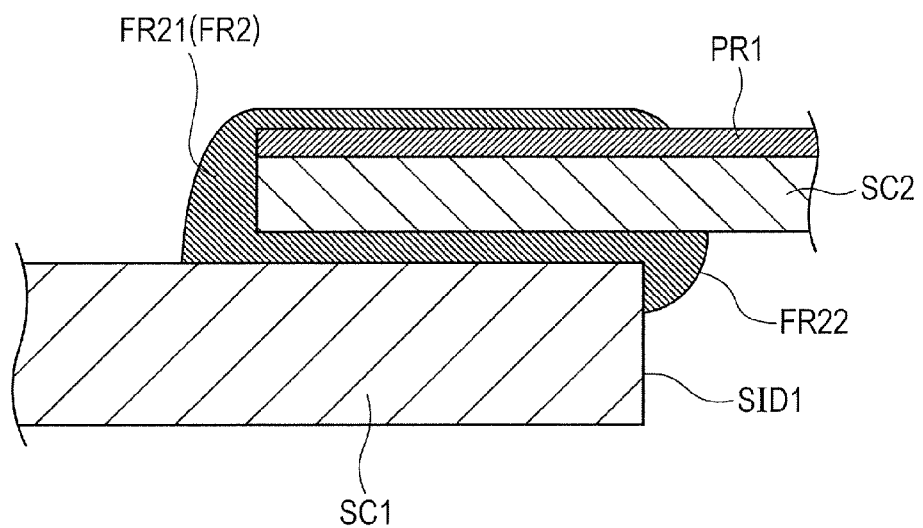
FIG. 9 is a sectional view showing a first example of a shape of a fixed layer.

FIG. 9 is a sectional view showing a first example of a shape of the fixed layer FR2. In the example shown in this figure, the fillet FR21 is made higher than the protective layer PR1 of the second semiconductor chip SC2. Moreover, a part of the fixed layer FR2 protrudes into a' side face of the first semiconductor chip SC1 on a side SID2 side, and forms a fillet FR22. Thus, since the fixed layer FR2 also forms the fillet FR22, a fixing strength of the second semiconductor chip SC2 to the first semiconductor chip SC1 becomes large. Thereby, as will be described later, in a step of attaching the second bonding wire WIR2 to the second semiconductor chip SC2, it is possible to suppress the second semiconductor chip SC2 from coming off from the first semiconductor chip SC1. Moreover, by the fillets FR21, FR22 being formed, it is possible to suppress the second semiconductor chip SC2 from bending resulting from a stress.

Moreover, it is also possible to suppress a dielectric breakdown from occurring between the second semiconductor chip SC2 and the first semiconductor chip SC1. In detail, starting point of the dielectric breakdown between the second semiconductor chip SC2 and the first semiconductor chip SC1 is a portion of the second semiconductor chip SC2 where its distance to the first semiconductor chip SC1 is short. In this embodiment, a portion of the side face of the second semiconductor chip SC2 that is located over the first semiconductor chip SC1 is covered with the fillet FR21. For this reason, it is possible to suppress the dielectric breakdown from occurring between the first semiconductor chip SC1 and the second semiconductor chip SC2 with the side face of the second semiconductor chip SC2 acting as a starting point.

Figure 10:
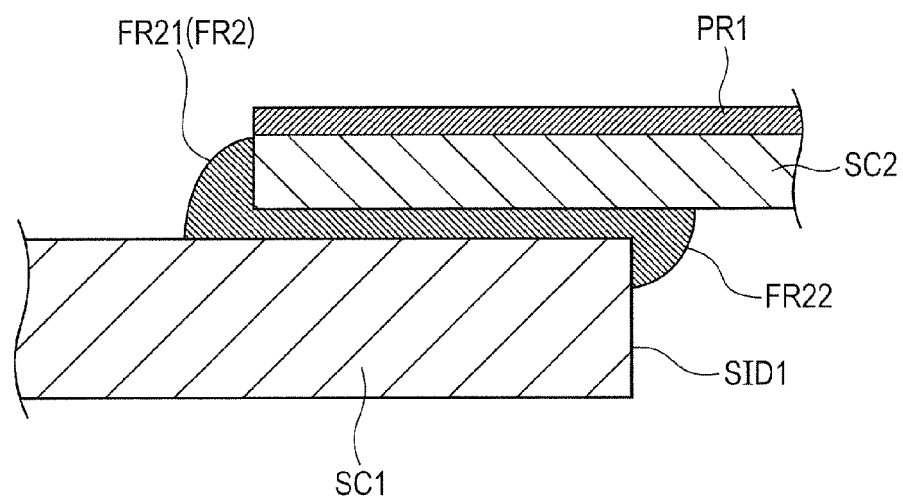
FIG. 10 is a sectional view showing a second example of the shape of the fixed layer.

FIG. 10 is a sectional view showing a second example of the shape of the fixed layer FR2. The example shown in this figure is the same as the example shown in FIG. 9 except for a point that the fillet FR21 does not reach the protective layer PR1.

Figure 11:
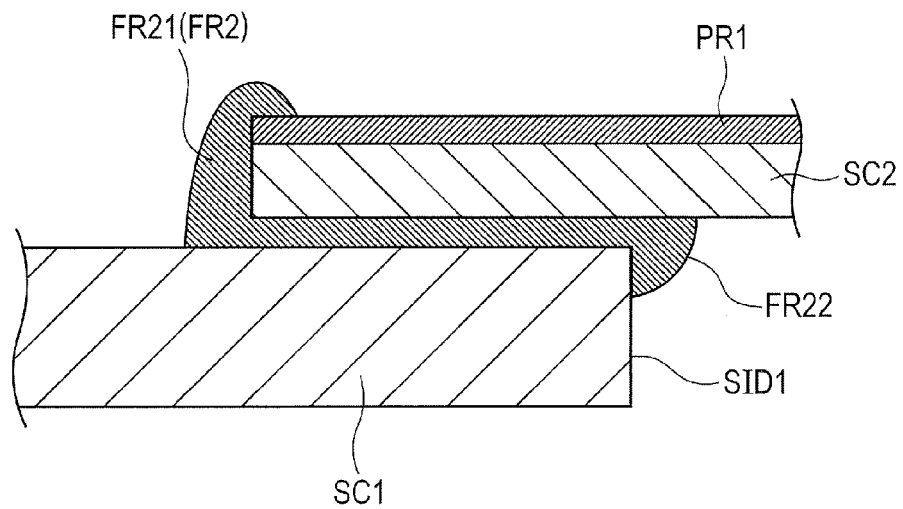
FIG. 11 is a sectional view showing a third example of the shape of the fixed layer.

FIG. 11 is a sectional view showing a third example of the shape of the fixed layer FR2. Although in the example shown in this figure, a part of the fillet FR21 is made higher than the protective layer PR1, it is the same as the example shown in FIG. 9 except for a point that a remaining portion of the fillet FR21 does not reach the protective layer PR1.

Each figure of FIG. 12 to FIG. 15 is a sectional view for explaining a method for manufacturing a semiconductor device SD. First, the first semiconductor chip SC1 and the second semiconductor chip SC2 are manufactured. The first semiconductor chip SC1 and the second semiconductor chip SC2 are manufactured as follows, for example.

First, an element isolation film is formed over the first substrate SUB1 (or the second substrate SUB2) that is in a wafer state. Thereby, an element formation region is isolated. The element isolation film is formed, for example, by using an STI method, but may be formed by using a LOCOS method. Next, a gate insulating film and a gate electrode are formed over the semiconductor substrate located in the element formation region. The gate insulating film may be a silicon oxide film, or may be a high dielectric constant film (for example, a hafnium silicate film) whose permittivity is higher than that of the silicon oxide film. In the case where the gate insulating film is the silicon oxide film, the gate electrode is formed with a polysilicon film. Moreover, in the case where, the gate insulating film is the high dielectric constant film, the gate electrode is formed with a laminated film of a metallic film (for example, TiN) and the polysilicon film. Moreover, when the gate electrode is formed with polysilicon, in a step of forming the gate electrode, polysilicon resistance may be formed over the element isolation film.

Next, an extension region of a source and a drain is formed over the semiconductor substrate that is located in the element formation region. Next, sidewalls are formed over side walls of the gate electrode. Next, an impurity region that becomes a source and a drain is formed in the semiconductor substrate located in the element formation region. Thus, a MOS transistor is formed over the semiconductor substrate.

Moreover, in a manufacturing step of the first semiconductor chip SC1, the first transistor TR1 and the second transistors TR2 are formed by using at least a part of the above-mentioned step.

Next, the first multilayer wiring layer MINC1 (or the second multilayer wiring layer MINC2) is formed over the element isolation film and the MOS transistor. The first electrode pads PAD11, PAD12 (or the second electrode pad PAD2) are formed over a wiring layer of an uppermost layer. Next, a protective insulation film (a passivation film) is formed over the multilayer wiring layer. An aperture located above the electrode pad is formed in the protective insulation film.

After this, the first semiconductor chip SC1 is formed by dicing the wafer that becomes the first semiconductor chips SC1 into individual chips.

Moreover, regarding the wafer that becomes the second semiconductor chips SC2, as shown in FIG. 12A, the protective layer PR1 is stuck down on a plane that serves as the fourth principal plane SFC4 of the second semiconductor chip SC2 in the wafer. Moreover, a bump BMP is formed on each of the second electrode pads PAD2. The bump BMP is formed with the use of a metal that easily join the second bonding wire WIR2 such as gold, for example.

Next, as shown in FIG. 12B, a wafer that becomes the second semiconductor chips SC2 is diced into individual chips together with the protective layer PR1. Thereby, the second semiconductor chip SC2 is manufactured with the protective layer PR1 provided over it.

Incidentally, before dicing the wafer into the first semiconductor chips SC1, the first substrate SUB1 of the first semiconductor chips SC1 is ground to be thinned. Similarly, before providing the protective layer PR1 over the second semiconductor chip SC2, the second substrate SUB2 of the second semiconductor chips SC2 is ground to be thinned, if needed.

Figure 13A:
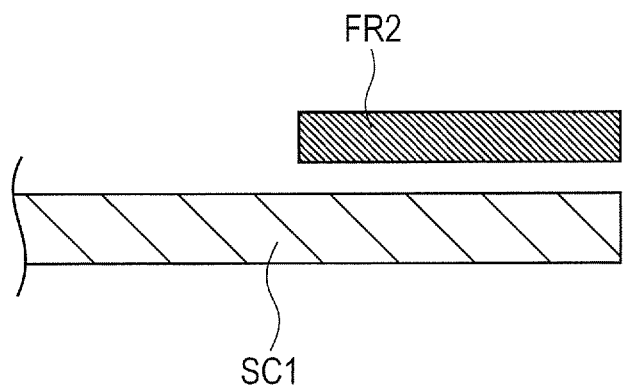
FIGS. 13A and 13B are sectional views for explaining the method for manufacturing a semiconductor device.
Figure 13B:
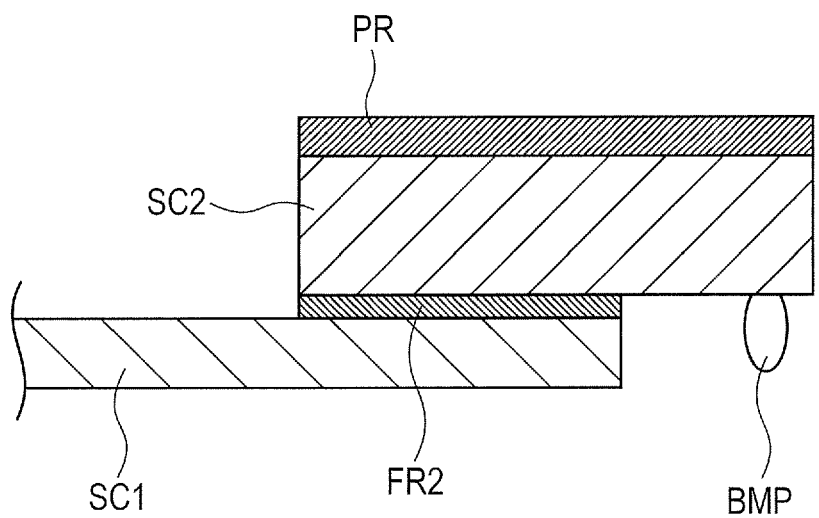

Next, as shown in FIG. 13A, the fixed layer FR2 is provided over a region of the first principal plane SFC1 of the first semiconductor chip SC1 over which the second semiconductor chip SC2 is mounted. Next, as shown in FIG. 13B, the second semiconductor chip SC2 is mounted over the first semiconductor chip SC1. At this time, the third principal plane SFC3 of the second semiconductor chip SC is made to face the fixed layer FR2. Moreover, the bump BMP of the second semiconductor chip SC2 is made not to be covered with the first semiconductor chip SC1 or the fixed layer FR2 at this time.

Figure 14A:
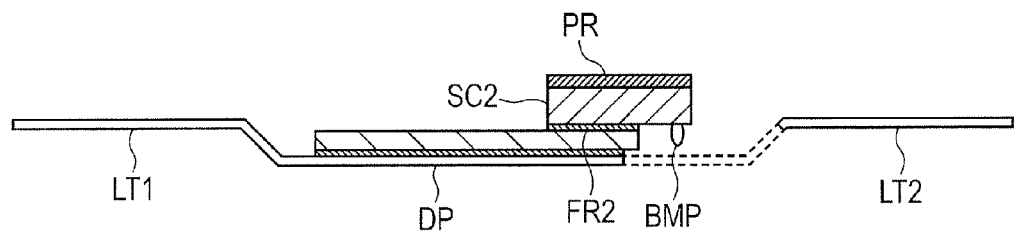
FIGS. 14A, 14B, and 14C are sectional views for explaining a method for manufacturing a semiconductor device.

Next, as shown in FIG. 14A, a laminated body of the first semiconductor chip SC1 and the second semiconductor chip SC2 is mounted over the chip mounting part DP of the lead frame with the use of the fixed layer FR1. At this time, the notch part CP of the chip mounting part DP and the bump BMP of the second semiconductor chip SC2 are made to overlap each other.

Figure 14B:
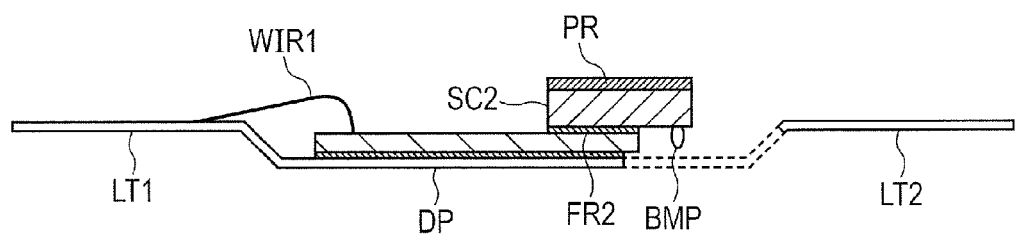

Next, as shown in FIG. 14B, the first electrode pads PAD11 and the first electrode pads PAD12 of the first semiconductor chip SC1 are coupled to the first lead terminals LT1 by using the first bonding wires WIR1. At this time, after one end of the first bonding wire WIR1 was fixed to the first electrode pad PAD11 (or the first electrode pad PAD12), the other end of the first bonding wire WIR1 is fixed to the first lead terminal LT1.

Figure 14C:
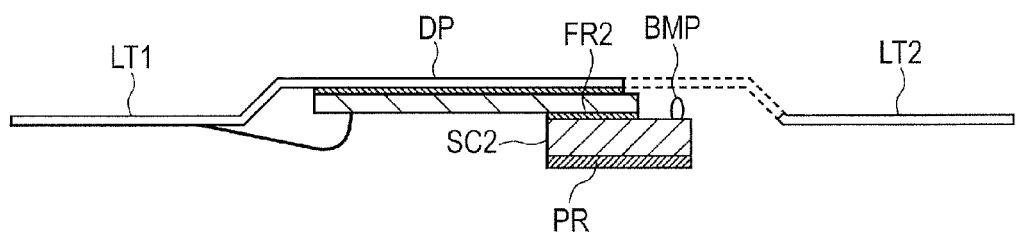

Then, as shown in FIG. 14C, the lead frame is turned upside down.

Figure 15A:
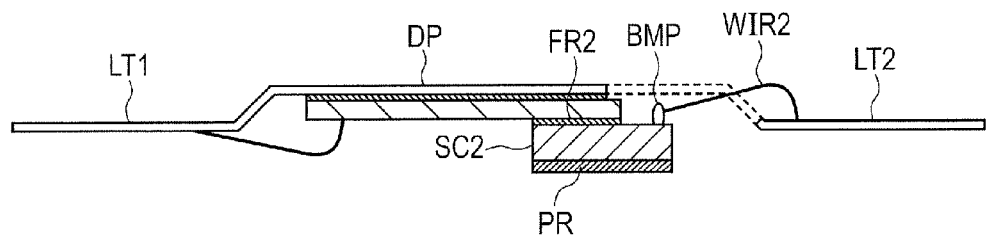
FIGS. 15A, 15B, and 15C are sectional views for explaining the method for manufacturing a semiconductor device.

Next, as shown in FIG. 15A, the second electrode pad PAD2 of the second semiconductor chip SC2 is coupled to the second lead terminal LT2 by using the second bonding wire WIR2. At this time, after the other end of the second bonding wire WIR2 was fixed to the second lead terminal LT2, the one end of the second bonding wire WIR2 is fixed to the bump BMP (namely, the second electrode pad PAD2). Incidentally, in order to perform this step, it is necessary to provide the same notch as the notch part CP also in a stage for holding the lead frame.

In this step, the bump BMP is formed in advance over the second electrode pad PAD2. For this reason, the one end of the second bonding wire WIR2 can be coupled to the second electrode pad PAD2 without pressing the one end of the second bonding wire WIR2 to the second electrode pad PAD2 firmly. Therefore, when the second bonding wire WIR2 is fixed to the second electrode pad PAD2, it is possible to suppress the second semiconductor chip SC2 from coming off from the first semiconductor chip SC1.

Moreover, when the other end of the second bonding wire WIR2 is attached to the second lead terminal LT2 after the one end of the second bonding wire WIR2 was attached to the second electrode pad PAD2, during a time when the other end of the second bonding wire WIR2 is attached to the second lead terminal LT2 after the one end of the second bonding wire WIR2 was attached to the second electrode pad PAD2, there arises a possibility that a force is added to the second semiconductor chip SC2 through the second bonding wire WIR2. In this case, there arises a possibility that the second semiconductor chip SC2 will come off from the first semiconductor chip SC1. In this embodiment, since the second bonding wire WIR2 is attached to the second electrode pad PAD2 after it was attached to the second lead terminals LT2, it is possible to suppress such a problem from occurring.

Moreover, the second semiconductor chip SC2 is made thicker than the first semiconductor chip SC1. Therefore, when the second bonding wire WIR2 is attached to the second semiconductor chip SC2, it is possible to suppress the second semiconductor chip SC2 from being damaged.

Figure 15B:
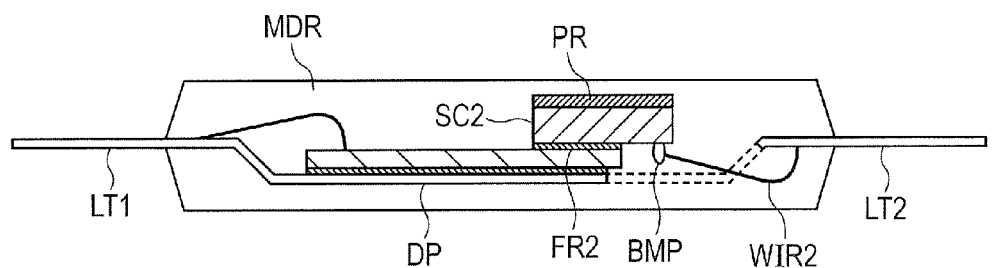

Then, as shown in FIG. 15B, the lead frame is turned upside down. Thereby, conveyance of the lead frame becomes easy. Next, the sealing resin MDR is formed by using a metallic mold for sealing.

Figure 15C:
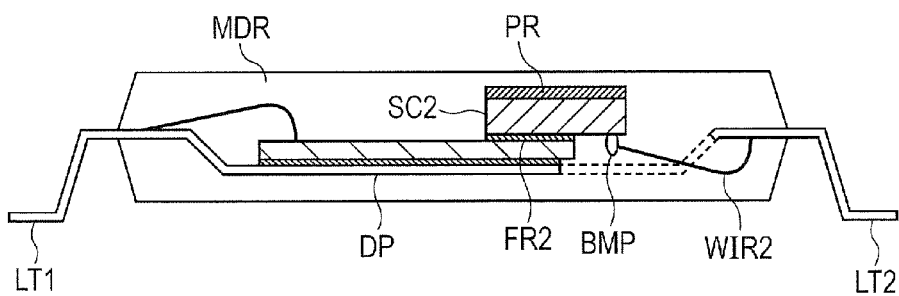

Next, as shown in FIG. 15C, portions of the first lead terminal LT1 and the second lead terminal LT2 that are located outside the sealing resin MDR are deformed to be made as terminals.

Incidentally, the second semiconductor chip SC2 may be mounted over the first semiconductor chip SC1 after mounting the first semiconductor chip SC1 over the chip mounting part DP.

Figure 16A:
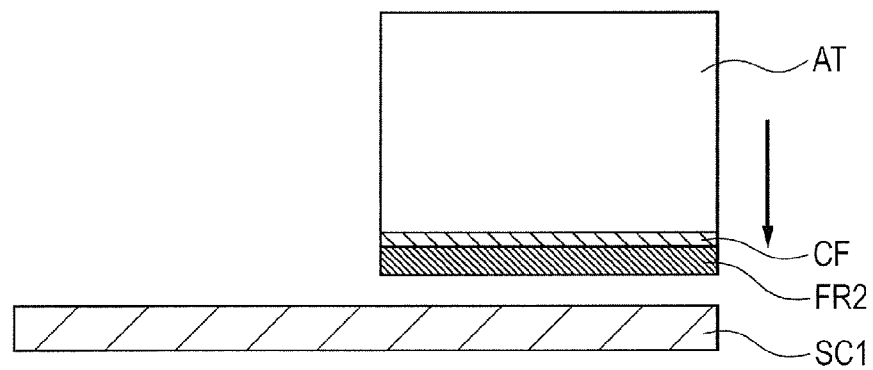
FIGS. 16A and 16B are flowcharts showing details of steps shown in FIGS. 13A and 13B.

FIG. 16 and FIG. 17 are flowcharts showing details of the step shown in FIGS. 13A and 13B. First, as shown in FIG. 16A, a sheet-like fixed layer FR2 cut into a predetermined shape is held (for example, being adsorbed) by using the assembly apparatus AT. In this state, a cover film CF is provided on a plane of the fixed layer FR2 that is held by the assembly apparatus AT. Next, by using the assembly apparatus AT, the fixed layer FR2 is pressed to a region of the first semiconductor chip SC1 over which the second semiconductor chip SC2 is mounted.

Figure 16B:
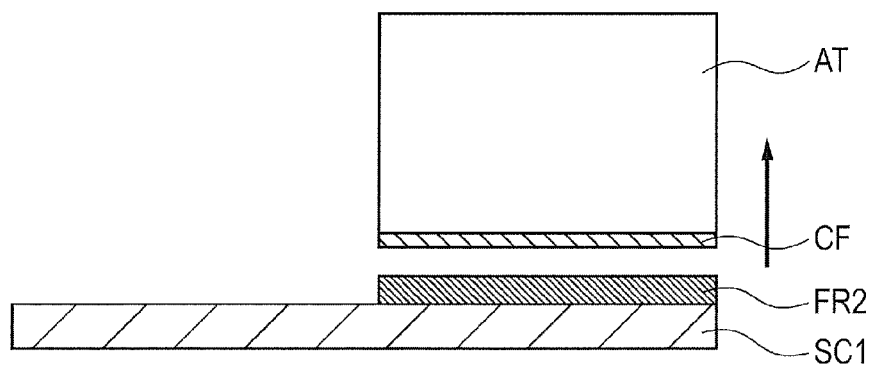

Next, as shown in FIG. 16B, the assembly apparatus AT is elevated with the cover film CF adsorbed thereto. Thereby, the cover film CF is removed from the fixed layer FR2.

Figure 17A:
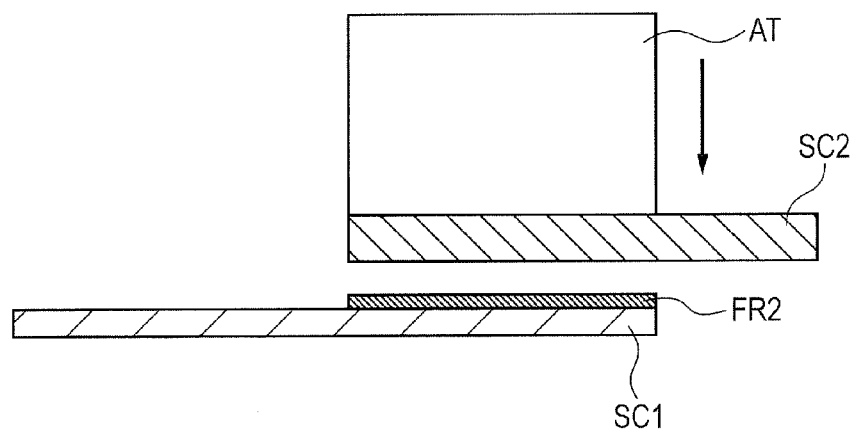
FIGS. 17A and 17B are flowcharts showing details of steps shown in FIGS. 13A and 13B.

Next, as shown in FIG. 17A, the assembly apparatus AT is made to hold the second semiconductor chip SC2. The assembly apparatus AT adsorbs, for example, the fourth principal plane SFC4 of the second semiconductor chip SC2. Since the fourth principal plane SFC4 is covered with the protective layer PR1 at this time, no flaw is given to the fourth principal plane SFC4.

Next, the second semiconductor chip SC2 is pressed to the fixed layer FR2 using the assembly apparatus AT. Thereby, the second semiconductor chip SC2 is fixed over the first semiconductor chip SC1. Moreover, the fillets FR21, FR22 are formed in the fixed layer FR2 at this time.

Figure 17B:
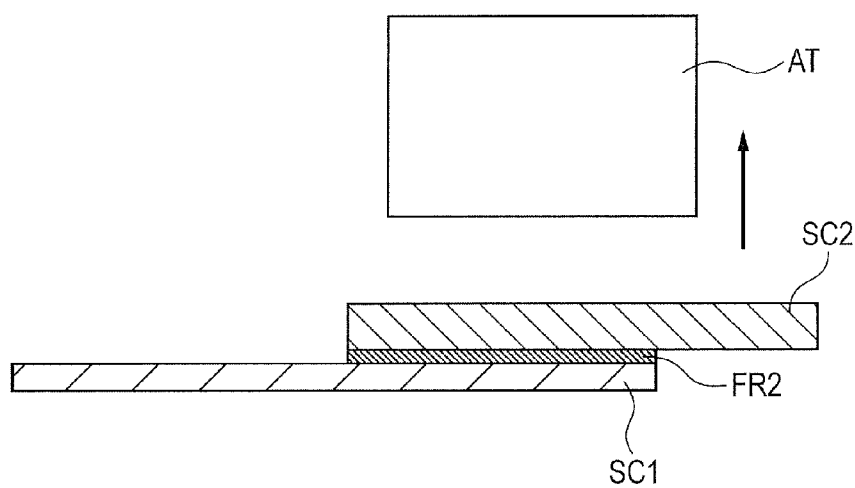

Then, as shown in FIG. 17B, the second semiconductor chip SC2 is detached from the assembly apparatus AT.

Next, an effect of this embodiment will be explained. The notch part CP is formed in the chip mounting part DP in this embodiment. Then, in plane view, the second electrode pad PAD2 of the second semiconductor chip SC2 overlaps the notch part CP. Therefore, when attaching the one end of the second bonding wire WIR2 to the second electrode pad PAD2, it is possible to suppress a bonding tool and the chip mounting part DP from interfering each other.

Moreover, second bonding wires WIR21 located at ends among multiple second bonding wires WIR2 (for example, the second bonding wire WIR2 located at a right end and the second bonding wire WIR2 located at a left end in FIG. 3) extend aslant to the side SID1 of the chip mounting part DP. For this reason, there arises a possibility that the second bonding wire WIR21 or the bonding tool for attaching this wire will contact with the end TP of the notch part CP. In contrast to this, in this embodiment, a taper is provided at the end TP of the notch part CP. Therefore, it is possible to suppress the second bonding wire WIR21 or the bonding tool for attaching this wire from contacting with the end TP of the notch part CP.

Modification

Figure 19:
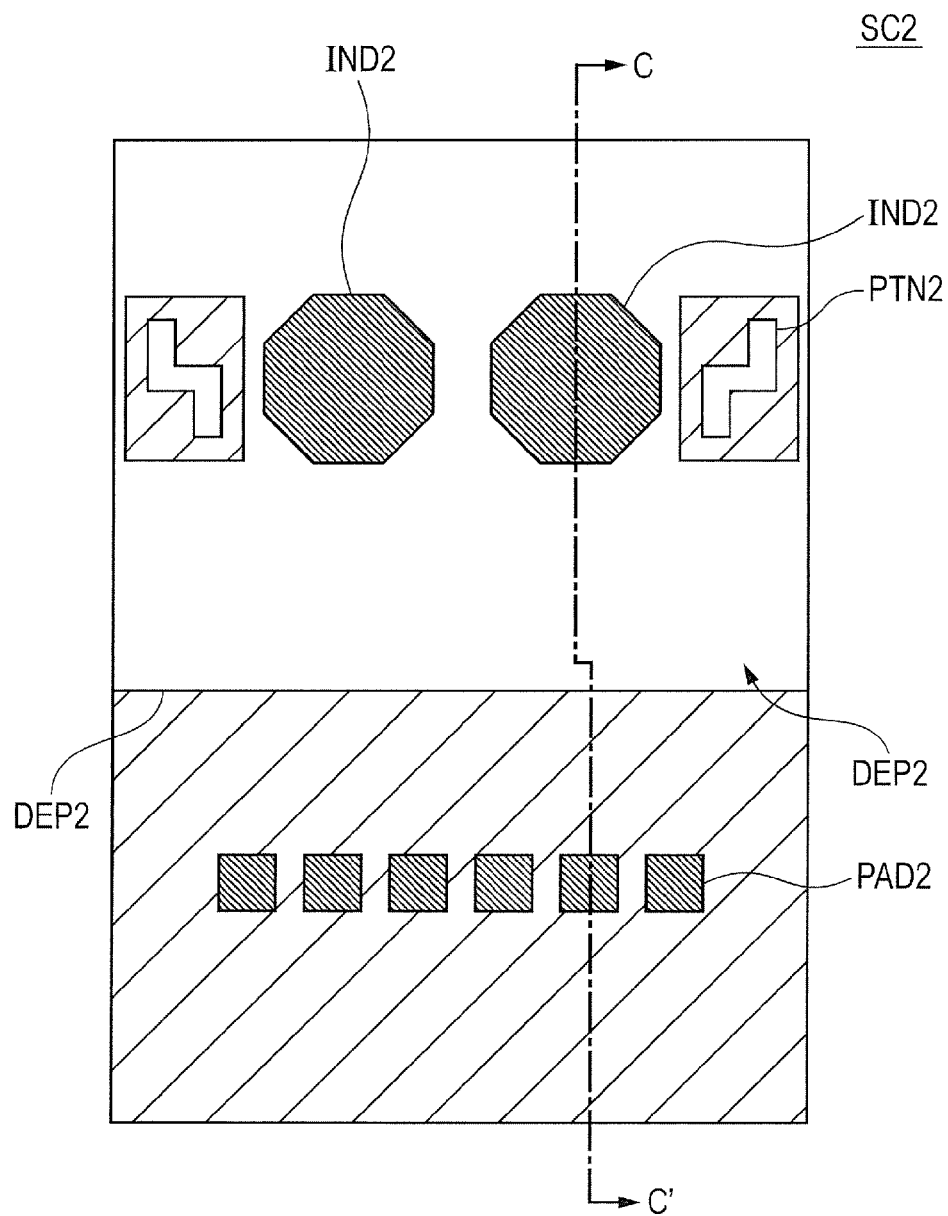
FIG. 19 is a plane view of a second semiconductor chip according to the modification.

FIG. 18 is a plane view of a first semiconductor chip SC1 according to a modification, and FIG. 19 is a plane view of a second semiconductor chip SC2 according to the modification. The semiconductor device SD according to this modification has the same configuration as that of the semiconductor device SD according to the embodiment except for points that a protrusion PTN1 is formed over the first principal plane SFC1 of the first semiconductor chip SC1 and that a depression PTN2 is formed over the second principal plane SFC2 of the second semiconductor chip SC2.

The protrusion PTN1 is formed with the use of the first multilayer wiring layer MINC1 of the first semiconductor chip SC1 or the protective insulation film over it; the depression PTN2 is formed with the use of the second multilayer wiring layer MINC2 of the second semiconductor chip SC2 or the protective insulation film over it. Specifically, the protrusion PTN1 is formed by removing a portion located in a circumference of the protrusion PTN1 over at least one layer of the uppermost layers of the first semiconductor chip SC1. Moreover, the depression PTN2 is formed by removing a region that will serve as the depression PTN2 in at least the one layer of the uppermost layers of the first semiconductor chip SC1.

A planar shape of the depression PTN2 is the same as a planar shape of the protrusion PTN1. Then, in a state where the first semiconductor chip SC1 and the second semiconductor chip SC2 are made to overlap each other, the protrusion PTN1 overlaps the depression PTN2. At least an upper part of the protrusion PTN1 may fit into the depression PTN2.

Also with this modification, the same effect as that of the embodiment can be acquired. Moreover, precision of relative positions of the first semiconductor chip SC1 and the second semiconductor chip SC2 can be raised by overlapping positions of the protrusion PTN1 and the depression PTN2. By this, it is possible to suppress communication error from occurring between the first inductor IND1 and the second inductor IND2. Especially, in the case where at least the upper part of the protrusion PTN1 is made to fit into the depression PTN2, precision of the relative positions of the first semiconductor chip SC1 and the second semiconductor chip SC2 becomes especially high.

Incidentally, even in the case where the depression is formed in the first principal plane SFC1 of the first semiconductor chip SC1 and the protrusion is formed in the third principal plane SFC3 of the second semiconductor chip SC2, the same effect as that of this modification ca be acquired.

In the foregoing, although the invention made by the present inventors was concretely explained based on the embodiments, it goes without saying that the present invention is not limited to the embodiments, and can be modified variously in a range that does not deviate from its gist.

What is claimed is:

1. A semiconductor device, comprising:
   a chip mounting part;
   a first semiconductor chip that has a first principal plane and a second principal plane being an opposite side plane to the first principal plane and is mounted over the chip mounting part in a direction in which the second principal plane faces the chip mounting part; and
   a second semiconductor chip that has a third principal plane and a fourth principal plane being an opposite side plane to the third principal plane and a part of which is mounted over the first semiconductor chip in a direction in which the third principal plane faces the first principal plane,
   wherein in plane view, the chip mounting part has a notch part and a part of the second semiconductor chip overlaps the notch part, and further
   wherein the semiconductor device comprises:
   a first electrode pad located in a portion of the first principal plane of the first semiconductor chip that does not overlap the second semiconductor chip;
   a second electrode pad located in a region of the third principal plane of the second semiconductor chip that overlaps the notch part;
   a first bonding wire whose one end couples to the first electrode pad; and
   a second bonding wire whose one end couples to the second electrode pad.

2. The semiconductor device according to claim 1, comprising:
   a first inductor formed over the first principal plane of the first semiconductor chip; and
   a second inductor formed over the third principal plane of the second semiconductor chip,
   wherein in plane view, the first inductor and the second inductor overlap each other.

3. The semiconductor device according to claim 1,
   wherein a width of a side of the first semiconductor chip that faces the notch part is wider than a width of the notch part, and
   wherein in plane view, a part of the first semiconductor chip overlaps the notch part.

4. The semiconductor device according to claim 1,
   wherein in plane view, a taper is formed in an end on an opening side of the notch part.

5. The semiconductor device according to claim 1, comprising:
   a first lead terminal to which the other end of the first bonding wire couples;
   a second lead terminal to which the other end of the second bonding wire couples;
   two third lead terminals arranged side by side with the second lead terminal;
   a terminal coupling part that couples mutually ends on the chip mounting part side of the two third lead terminals; and
   a sealing resin that seals the followings: the chip mounting part; the first semiconductor chip; the second semiconductor chip; the first bonding wire; the second bonding wire; a portion of the first lead terminal to which at least the first bonding wire couples; a portion of the second lead terminal to which at least the second bonding wire couples; a portion of the two third terminals to which at least the terminal coupling part couples; and the terminal coupling part.

6. The semiconductor device according to claim 5,
   wherein in plane view, the second lead terminal and the third lead terminal are arranged on the opposite side of the first lead terminal across the chip mounting part, and
   wherein a distance from the second lead terminal to the chip mounting part is farther than a distance from the first lead terminal to the chip mounting part.

7. The semiconductor device according to claim 5, comprising:
   a plurality of sets each comprised of the two third lead terminals and the terminal coupling part; and
   having a plurality of the second lead terminals between the first set and the second set.

8. The semiconductor device according to claim 5, in plane view, the second lead terminal and the third lead terminal being arranged on the opposite side of the first lead terminal across the chip mounting part, the device comprising:
   a plurality of the first lead terminals; and
   a support part that is located between the first lead terminals, and is coupled to the chip mounting part.

9. The semiconductor device according to claim 5,
   wherein an angle of the other end of the first bonding wire to the first lead terminal is smaller than an angle of the one end of the first bonding wire to the first semiconductor chip, and
   wherein an angle of the other end of the second bonding wire to the second lead terminal is larger than an angle of the one end of the second bonding wire to the second semiconductor chip.

10. The semiconductor device according to claim 1,
    wherein the second semiconductor chip is thicker than the first semiconductor chip.

11. The semiconductor device according to claim 1, comprising:
    a protective layer provided over the fourth principal plane of the second semiconductor chip.

12. The semiconductor device according to claim 1, comprising:
    a power controller element formed over the first semiconductor chip.

13. The semiconductor device according to claim 1, comprising:
- a fixed layer located between the third principal plane of the second semiconductor chip and the first principal plane of the first semiconductor chip,
- wherein one part of the fixed layer is located over a side face of the second semiconductor chip and the other part of the fixed layer is located over a region of a side face of the first semiconductor chip that overlaps the second semiconductor chip.

14. The semiconductor device according to claim 1, comprising:
- a protrusion formed in either one of the first principal plane of the first semiconductor chip and the third principal plane of the second semiconductor chip; and
- an another notch part formed in the other of the first principal plane of the first semiconductor chip and the third principal plane of the second semiconductor chip,
- wherein in plane view, an outer shape of the protrusion and an outer shape of the other notch part have the same shape and the protrusion and the other notch part overlap each other.

15. The semiconductor device according to claim 1, wherein the notch is formed at a peripheral edge of the chip mounting part.

* * * * *